United States Patent
Ma et al.

(10) Patent No.: US 10,466,545 B2
(45) Date of Patent: Nov. 5, 2019

(54) METHOD AND DEVICE FOR PROCESSING PHOTORESIST COMPONENT

(71) Applicants: BOE Technology Group Co., Ltd., Beijing (CN); Beijing BOE Display Technology Co., Ltd., Beijing (CN)

(72) Inventors: Shichao Ma, Beijing (CN); Pengfei Wang, Beijing (CN); Chongxi Wei, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 10 days.

(21) Appl. No.: 15/679,510

(22) Filed: Aug. 17, 2017

(65) Prior Publication Data

US 2018/0188565 A1  Jul. 5, 2018

(30) Foreign Application Priority Data

Jan. 3, 2017 (CN) .......................... 2017 1 0003107

(51) Int. Cl.
| | | |
|---|---|---|
| *G03F 7/20* | (2006.01) | |
| *G02F 1/1339* | (2006.01) | |
| *G03F 7/09* | (2006.01) | |
| *G03F 7/039* | (2006.01) | |
| *H01L 21/16* | (2006.01) | |

(52) U.S. Cl.
CPC ........ *G02F 1/1339* (2013.01); *G02F 1/13394* (2013.01); *G03F 7/039* (2013.01); *G03F 7/091* (2013.01); *G03F 7/7075* (2013.01); *G03F 7/70875* (2013.01); *H01L 21/164* (2013.01); *G02F 2001/13398* (2013.01)

(58) Field of Classification Search
CPC ........ G02F 1/1339; G03F 7/039; G03F 7/091; G03F 7/7075; G03F 7/70875; H01L 21/164
See application file for complete search history.

(56) References Cited

U.S. PATENT DOCUMENTS

| | | | | |
|---|---|---|---|---|
| 6,402,509 B1 * | 6/2002 | Ookura | ............. | H01L 21/67248 219/405 |
| 6,984,477 B2 * | 1/2006 | Ogata | ..................... | G03F 7/162 427/8 |
| 6,992,270 B2 * | 1/2006 | Lee | ................... | H01L 21/67248 118/724 |
| 7,425,689 B2 * | 9/2008 | Kulp | ................. | H01L 21/67109 118/725 |

(Continued)

*Primary Examiner* — Deoram Persaud
(74) *Attorney, Agent, or Firm* — Westman, Champlin & Koehler, P.A.

(57) ABSTRACT

The present disclosure provides a method for processing a photoresist component, including steps of: placing a photoresist component to be processed on a heating device comprising a plurality of heating components; and controlling, based on a heating parameter, each of the plurality of heating components associated with the heating parameter to heat the photoresist component to be processed. The heating parameter is determined based on a photoresist component parameter of the photoresist component to be processed and a process parameter of forming the photoresist component. The present disclosure further provides a device for processing a photoresist component.

10 Claims, 6 Drawing Sheets

(56) References Cited

U.S. PATENT DOCUMENTS

| | | | | |
|---|---|---|---|---|
| 8,014,895 B2* | 9/2011 | Iwanaga | ............ | H01L 21/67103 |
| | | | | 219/405 |
| 8,933,376 B2* | 1/2015 | Fukuoka | ............. | F27B 17/0025 |
| | | | | 219/405 |
| 9,267,742 B2* | 2/2016 | Bera | ......................... | F28F 3/12 |
| 2003/0008242 A1* | 1/2003 | Schedel | .................... | G03F 7/38 |
| | | | | 430/313 |
| 2004/0147066 A1* | 7/2004 | Yamazaki | ............. | G03F 7/0007 |
| | | | | 438/151 |
| 2004/0226936 A1* | 11/2004 | Oyama | ............. | H01L 21/67103 |
| | | | | 219/444.1 |
| 2006/0222975 A1* | 10/2006 | Ke | ...................... | G03F 7/70625 |
| | | | | 430/30 |
| 2008/0257495 A1* | 10/2008 | Tadokoro | ............ | G03F 7/70483 |
| | | | | 156/345.27 |
| 2009/0078695 A1* | 3/2009 | Jyousaka | ............ | G05D 23/1932 |
| | | | | 219/494 |
| 2009/0104548 A1* | 4/2009 | Tanaka | ....................... | G03F 7/38 |
| | | | | 430/30 |
| 2012/0164585 A1* | 6/2012 | Ikeda | ................. | G03F 7/70425 |
| | | | | 430/325 |
| 2013/0323651 A1* | 12/2013 | Solak | ...................... | G03F 7/201 |
| | | | | 430/322 |
| 2014/0044429 A1* | 2/2014 | Hu | ........................... | G03D 5/00 |
| | | | | 396/611 |
| 2014/0065556 A1* | 3/2014 | Oori | ........................... | G03F 7/20 |
| | | | | 430/325 |
| 2015/0234326 A1* | 8/2015 | Huang | ................. | G03G 15/104 |
| | | | | 349/1 |
| 2015/0310158 A1* | 10/2015 | Wang | ................. | G06F 17/5081 |
| | | | | 716/53 |
| 2017/0018438 A1* | 1/2017 | Yanai | ................ | H01L 21/31144 |

\* cited by examiner

METHOD AND DEVICE FOR PROCESSING PHOTORESIST COMPONENT

CROSS-REFERENCE TO RELATED APPLICATION

This application claims the benefit of Chinese Patent Application No. CN201710003107.5 filed on Jan. 3, 2017 in the State Intellectual Property Office of China, the whole disclosure of which is incorporated herein by reference.

BACKGROUND OF THE DISCLOSURE

Field of the Disclosure

At least one embodiment of the present disclosure relates to a technical field of display, more particularly, relates to a method and a device for processing a photoresist component such as a post spacer.

Description of the Related Art

A display panel of a Liquid Crystal Display (LCD) generally comprises an array substrate, a liquid crystal layer and a color filter substrate. Thickness of a liquid crystal cell is controlled by forming a Post Spacer/Photo Spacer (PS) on the array substrate or the color filter substrate. For example, the post spacer may be formed on the color filter substrate on which a black matrix, a color pixel layer and a common electrode layer have been formed, so as to control the thickness of the liquid crystal cell by the post spacer.

However, in the relevant art of forming the post spacer, sizes of the post spacers formed on the array substrate or the color filter substrate are not uniform, which leads deformations of the post spacers inconsistent, and decreases the display quality of the display panel.

SUMMARY OF THE DISCLOSURE

According to an aspect of the present disclosure, there is provided a method for processing a photoresist component, comprising steps of: placing a photoresist component to be processed on a heating device comprising a plurality of heating components; and controlling, based on a heating parameter, each of the plurality of heating components associated with the heating parameter to heat the photoresist component to be processed.

According to an exemplary embodiment of the present disclosure, the heating parameter is determined based on a photoresist component parameter of the photoresist component to be processed and a process parameter of forming the photoresist component.

According to another exemplary embodiment of the present disclosure, the heating parameter comprises a heating temperature, and the photoresist component parameter comprises a size of the photoresist component and a position of the photoresist component on a substrate.

According to another exemplary embodiment of the present disclosure, the process parameter comprises at least one of an exposure process parameter and a development process parameter, and the method further comprises a step of determining the heating parameter based on the photoresist component parameter and at least one of the exposure process parameter and the development process parameter.

According to another exemplary embodiment of the present disclosure, the exposure process parameter comprises an illumination distribution of an exposure light source on the substrate on which the photoresist component is located; and the step of determining the heating parameter based on the photoresist component parameter and at least one of the exposure process parameter and the development process parameter comprises: estimating sizes of the photoresist components at different positions on the substrate according to a direct proportional relationship between the illumination distribution of the exposure light source on the substrate and the size of the photoresist component; and determining the heating temperature according to an inverse proportional relationship between the estimated size of the photoresist component and the heating temperature.

According to another exemplary embodiment of the present disclosure, the development process parameter comprises a tilt direction and a tilt degree of a developing machine; and the step of determining the heating parameter based on the photoresist component parameter and at least one of the exposure process parameter and the development process parameter comprises: determining an upstream position and a downstream position in a flow direction of a developing liquid based on the tilt direction and the tilt degree, and determining amounts of the developing liquid at the upstream position and the downstream position of the substrate, respectively; estimating the sizes of the photoresist components at different positions on the substrate according to an inverse proportional relationship between the amount of the developing liquid and the size of the photoresist component; and determining the heating temperature according to an inverse proportional relationship between the estimated size of the photoresist component and the heating temperature.

According to another exemplary embodiment of the present disclosure, the method further comprises steps of: exposing the processed photoresist component and developing the exposed photoresist component.

According to another exemplary embodiment of the present disclosure, the photoresist component comprises a post spacer, and the size of the photoresist component comprises a top diameter of the post spacer.

According to another exemplary embodiment of the present disclosure, the heating device is configured to be a heating tray having a plurality of heating components, and the step of heating the photoresist component to be processed comprises a step of heating the photoresist component to be processed by heat contact.

According to another aspect of the present disclosure, there is provided a device for processing a photoresist component, comprising: a heating device comprising a plurality of heating components and configured to carry a photoresist component to be processed thereon; and a controller configured to control, based on a heating parameter, each of the plurality of heating components associated with the heating parameter to heat the photoresist component to be processed.

According to an exemplary embodiment of the present disclosure, the heating parameter is determined based on a photoresist component parameter of the photoresist component to be processed and a process parameter of forming the photoresist component.

According to another exemplary embodiment of the present disclosure, the heating parameter comprises a heating temperature, and the photoresist component parameter comprises a size of the photoresist component and a position of the photoresist component on a substrate.

According to another exemplary embodiment of the present disclosure, the device further comprises a storage device configured to store sets of photoresist component parameters, process parameters and heating parameters which are associated with each other, and the controller is further configured to read out the heating parameter associated with each heating component from the storage device.

According to another exemplary embodiment of the present disclosure, the process parameter comprises a tilt direction and a tilt degree of a developing machine, and/or an illumination distribution of an exposure light source on the substrate on which the photoresist component is located.

According to another exemplary embodiment of the present disclosure, the heating device is configured to be a heating tray which is configured to heat the photoresist component to be processed by heat contact.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF PREFERRED EMBODIMENTS

Figure 1:
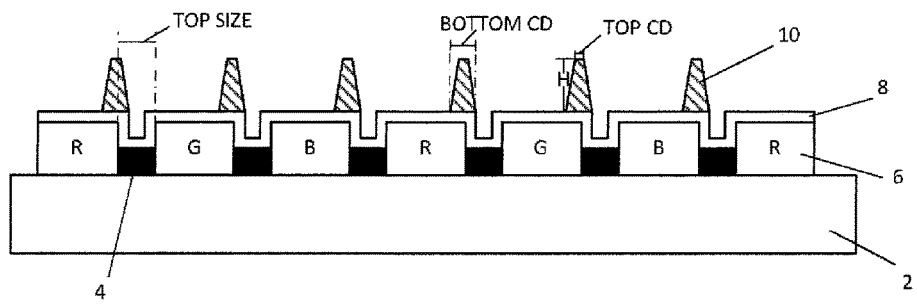
FIG. 1 is an illustrative cross section view of a color filter substrate according to an embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the present disclosure, the expression of "photoresist component" may refer to any component formed by a photoresist material, such as photoresist glue or photoresist agent or by a photolithography process. Herein, the photoresist component comprises, but not limited to, a post spacer, a black matrix, a photo unit formed on an array substrate.

Before discussing in detail the method and the device for processing the photoresist component according to the present disclosure, it is necessary to describe the structure of a color filter (CF) substrate and a process of forming a post spacer/photo spacer (PS) on the color filter substrate.

FIG. 1 illustratively shows a color filter substrate. As shown in FIG. 1, the color filter substrate may comprise a substrate 2, a black matrix 4, a color filter 6, a transparent electrode layer 8 and a post spacer 10. The substrate 2 is, for example, a glass substrate. The black matrix 4 is formed on the substrate 2. A plurality of color filters 6 configured to display different base colors, for example, Red (R), Green (G) and Blue (B) are separated by the black matrix 4. The transparent electrode layer 8 is provided on the color filters 6, and the post spacers 10 are provided on the transparent electrode layer 8. As shown in FIG. 1, a plurality of post spacers 10 are arranged on the substrate 2. The post spacer 10 generally comprises a trapezoidal cross section. Some sizes, such as height (H), top diameter (TOP CD), bottom diameter (BOTTOM CD), of the post spacer 10 have great influence on the uniformity of the thickness of the liquid crystal box.

Figure 2:
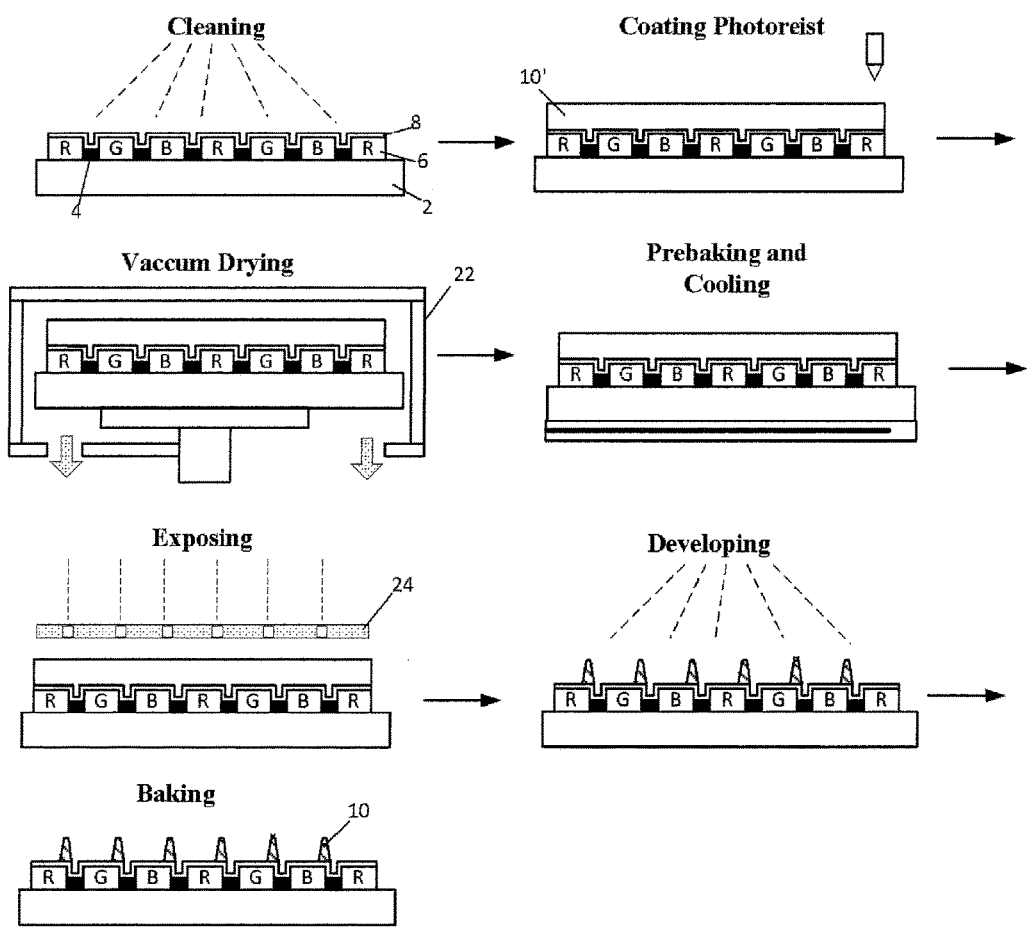
FIG. 2 is an illustrative process diagram of a method for forming a post spacer according to an embodiment of the present disclosure.
Figure 3:
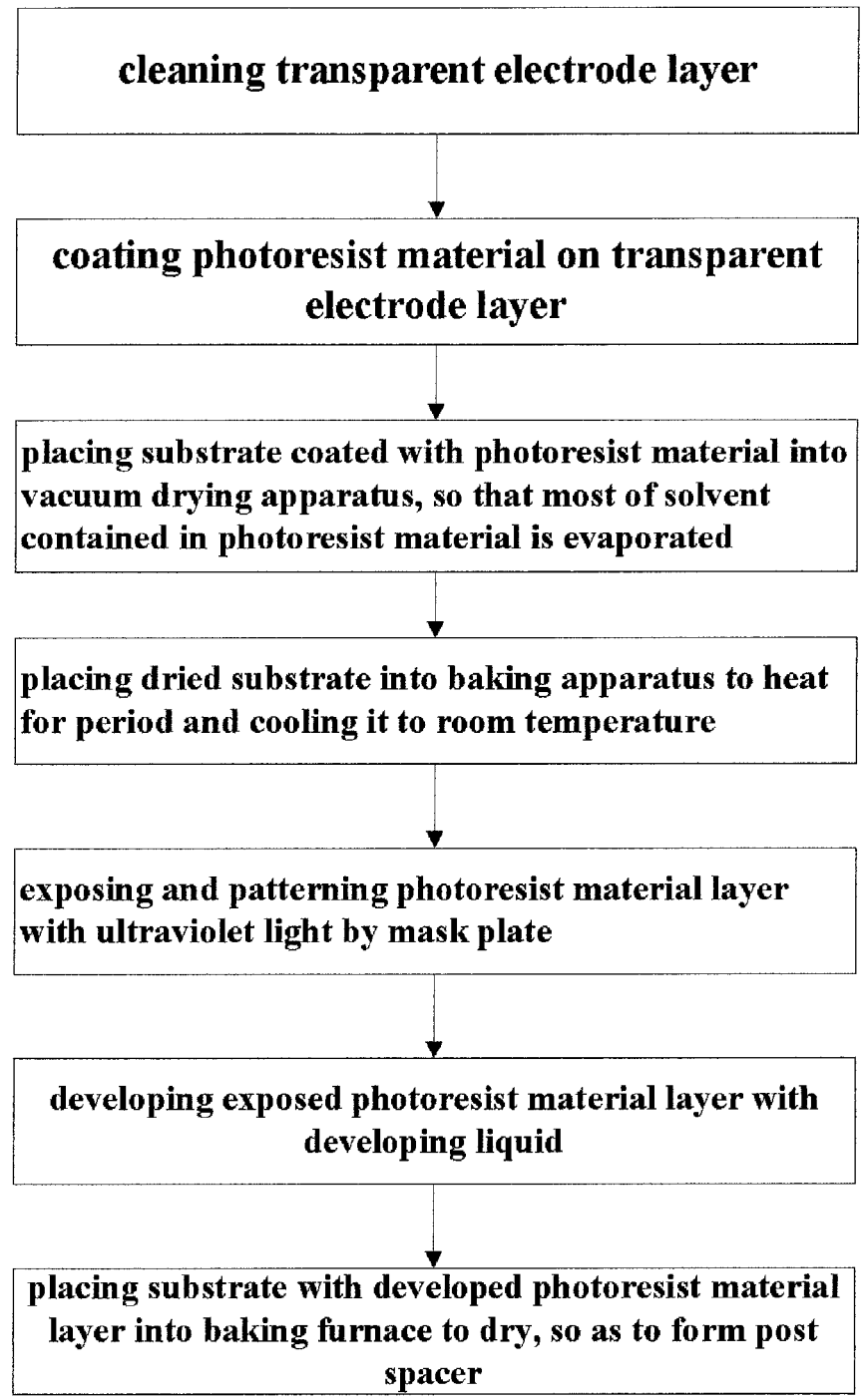
FIG. 3 is an illustrative flow chart of a method for forming the post spacer according to an embodiment of the present disclosure.

FIG. 2 is an illustrative process diagram of a method for forming a post spacer according to an embodiment of the present disclosure; FIG. 3 is an illustrative flow chart of a method for forming the post spacer according to an embodiment of the present disclosure.

As shown in FIGS. 2 and 3, in a cleaning step, the formed transparent electrode layer 8 is cleaned. In a step of coating photoresist material (such as, photoresist glue), the photoresist material is coated on the transparent electrode layer 8 by a rotary coater, a slit and rotary coating machine, or a slit coater, so as to form a photoresist material layer 10'. The photoresist material is a kind of light sensitive organic compound, solubility of which will change in a developing liquid after being exposure by, for example, ultraviolet (UV) light. Generally, the photoresist glue may be divided into positive photoresist glue and negative photoresist glue. The positive photoresist glue is insoluble in the developing liquid before being exposed, but becomes soluble in the developing liquid after being exposed. The negative photoresist glue is soluble in the developing liquid before being exposed, but becomes insoluble in the developing liquid after being exposed. In a vacuum drying step, the substrate 2 on which the photoresist material is coated is placed in a vacuum drying apparatus 22, so that most of solvent contained in the photoresist material is evaporated, for example, about 80% of solvent is evaporated. In a pre-baking and cooling step, the vacuum dried substrate 2 is placed in a baking apparatus and is heated for a period at a temperature of 80-120° C., for example, is heated for 90-180 seconds at the temperature of 90° C. Then, the substrate 2 is cooled to the room temperature, for example, 23° C.

The pre-baking step and the pre-baking apparatus will be described later in detail. The pre-baking step may also be called as prebaking or soft baking step. After dried by the vacuum drying apparatus 22, a certain amount of solvent is still remained in the glue film. Thereby, if the photoresist material is directly exposed without undergoing the prebaking or soft baking step, the size and the integrity of the exposure pattern would be affected. That is, the solvent remained in the glue film is further evaporated in the prebaking step, which improves the size and the integrity of the resultant post spacer. In an exposing step, the photoresist material layer 10' is exposed and patterned with an ultraviolet light by a mask plate 24. In a developing step, the photoresist material layer 10' is developed in the developing liquid. In this illustrated embodiment, by the developing step, the exposed part of the photoresist material is removed, the unexposed part of the photoresist material is left. In a baking step, the substrate 2 provided with the developed photoresist material layer 10' is placed in a baking furnace and is baked by a hot air in the baking furnace, so as to form the post spacer 10.

Figures 4, 5:
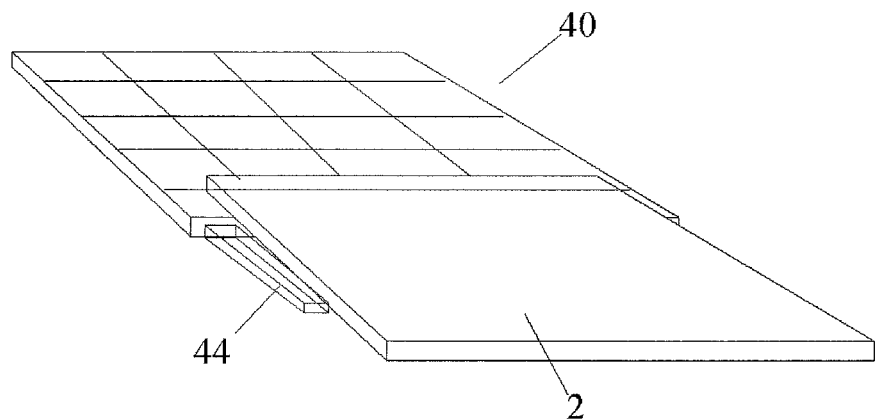
FIG. 4 is an illustrative view of a heating apparatus according to an embodiment of the present disclosure.
FIG. 5 is an illustrative arrangement diagram of heating components of the heating apparatus according to an embodiment of the present disclosure.

FIG. 4 is an illustrative view of a baking apparatus 40 used in the prebaking step. As shown in FIG. 4, in the LCD production line, when the substrate 2 is transmitted to the workstation of the baking apparatus 40, a mechanical arm 44 of the baking apparatus is extends out and holds the substrate 2 from below, then the mechanical arm 44 retracts back into the baking apparatus. Then, the heating device of the baking apparatus is turned on, so as to heat the substrate 2 to a target temperature. In an embodiment, as shown in FIG. 5, the heating device may comprise a heating tray 50. The heating tray 50 is configured to heat the substrate 2 by direct heat contact. For example, the heating tray 50 may comprise a heating wire 502 (as shown in FIG. 5), so as to heat the substrate 2. In an embodiment, as shown in FIG. 5, the heating wire 502 may comprise a heating wire wound into rings. However, the present disclosure is not limited to this, the heating wire 502 may also have other forms.

With the popularity of large-size display products, the size of the substrate 2 becomes more and more large, while the size of the mask plate is less than that of the substrate 2. For example, in an embodiment, the size of the substrate 2 is 2.2 m*2.5 m, and the size of the mask plate is 1.1 m*1.3 m. Thereby, in the above exposing step, it needs to perform 4-shot (4 exposures) or 6-Shot (6 exposures) process on the substrate. In each exposure, because of the loss of the optical path, the light intensity or the illumination at different positions on the substrate 2 are different. The light intensity or the illumination will affect the external contour of the resultant post spacer. That is, if the illumination distribution is not uniform on the substrate 2, it will cause the external contours or sizes of resultant post spacers inconsistent. As a result, the post spacers 10 at different positions on the substrate 2 may have different external contours or sizes. For example, the inventor finds that, in the embodiment in which the size of the substrate 2 is 2.2 m*2.5 m and the size of the mask plate is 1.1 m*1.3 m, because the illumination distribution is not uniform in the exposing step, there are about 3-5% differences in the top diameters (TOP CD, see FIG. 2) of the plurality of post spacers 10 formed on the substrate 2.

Figure 6:
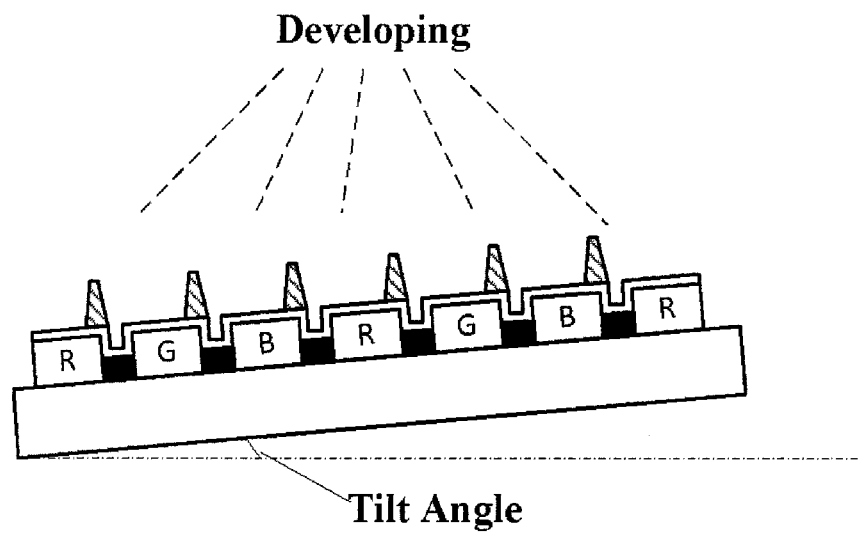
FIG. 6 illustratively shows a tilt angle of a developing machine used in the method of FIG. 2.

In an embodiment, in the developing step, in order to facilitate the drainage of the developing liquid, the substrate 2 is generally disposed obliquely in the developing apparatus. The substrate is held on a support table of the developing machine for supporting the substrate and is in parallel with the support table, thereby, in order to keep the substrate 2 tilted, it needs to adjust the developing machine to be in an inclined state. That is, the developing machine is disposed to have a tilt or inclination direction and a tilt degree or inclination with respect to a horizontal plane. The tilt degree generally is indicated by a tilt angle α of the substrate with respect to the horizontal plane, as shown in FIG. 6. In an embodiment, the height of the substrate decreases gradually from the right side to the left side of FIG. 6 in the tilt direction, the tilt angle α is about 5°. In this way, the amount of the developing liquid distributed on the upstream side (the right side of FIG. 6) is different from that of the developing liquid distributed on the downstream side (the left side of FIG. 6). In particular, the amount of the developing liquid distributed on the downstream side is more than that of the developing liquid distributed on the upstream side. Since the amount of the developing liquid affects the external contour (for example, the top diameter) of the resultant post spacer, the external contour of the post spacer formed on the upstream side is different from that of the post spacer formed on the downstream side.

Figure 7:
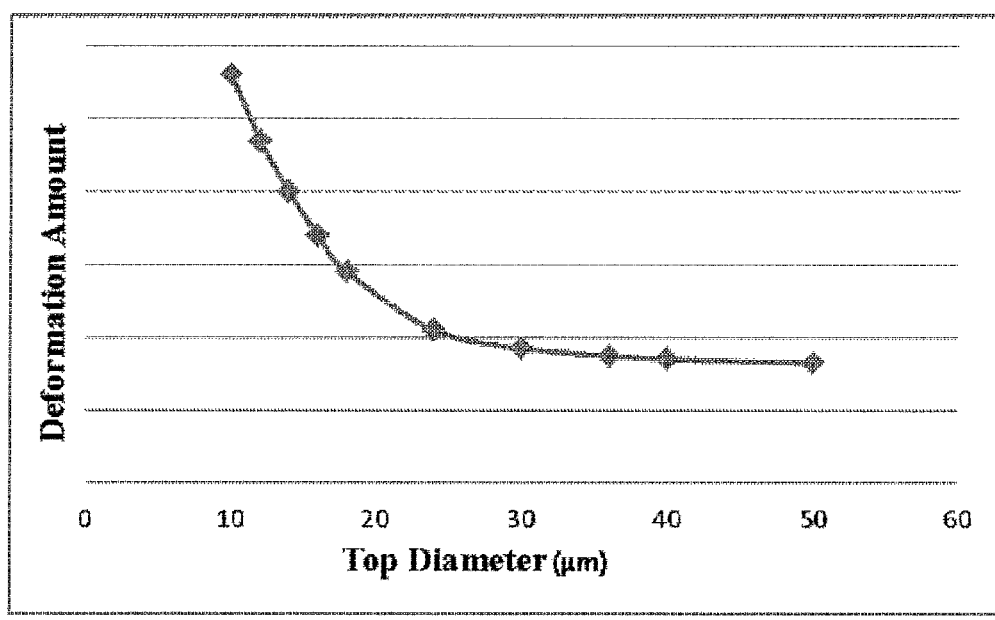
FIG. 7 illustratively shows a relationship between a deformation and a top diameter of the post space.

Through the above analysis, affected by the exposing process and/or the developing process, the external contours (for example, the top diameters) of the resultant post spacers may be not uniform. That is, the top diameters of the post spacers 10 at different positions on the substrate 2 may be not uniform. In an embodiment, as shown in FIG. 7, there is a relationship between the top diameter of the post spacer and deformation amount of the post spacer. As shown in FIG. 7, the lateral axis indicates the top diameter of the post spacer, and the unit of lateral axis is μm; the vertical axis indicates the deformation amount of the post spacer, the deformation amount may be referred as a percentage of the compressed height of the post spacer to the original height thereof. Please be noted that FIG. 7 only illustratively shows a relationship between the top diameter and the deformation amount of the post spacer, but is not limited to a specific value of the deformation amount. Thereby, FIG. 7 does not show the specific value of the deformation amount of the post spacer. If the top diameters of the post spacers are not uniform, then the deformation amounts of the post spacers when they are compressed are not consistent. That is, the deformation amount of the post spacers at some positions on the substrate may be larger than that of the post spacers at other positions on the substrate. As a result, it may cause the thickness of the liquid crystal cell uneven, thus affecting the display quality.

Figure 8:
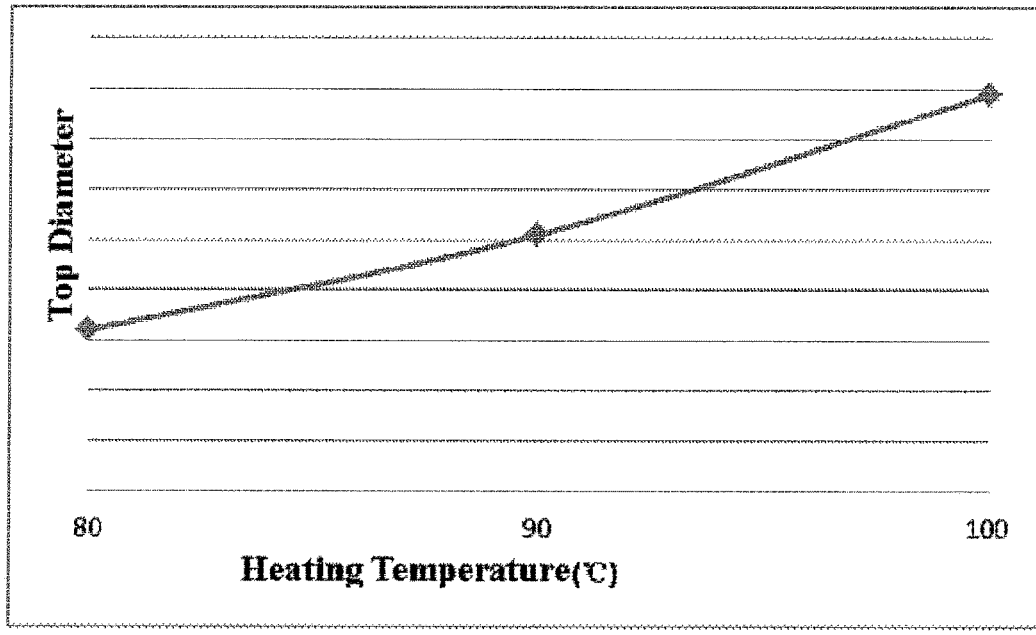
FIG. 8 illustratively shows a relationship between a top diameter of a post spacer and a heating temperature.

It is found by the inventor that the solvent remained in the glue film is further volatilized in the above prebaking step, so as to control the size of the resultant post spacer. In addition, the heating temperature in the prebaking step is related to the top diameter of the post spacer. FIG. 8 illustratively shows the relationship between the top diameter of the post spacer and the heating temperature. In FIG. 8, the lateral axis indicates the heating temperature, and the unit of which is ° C.; the vertical axis indicates the top diameter, and the unit of which is μm. Please be noted that FIG. 8 only illustratively shows a relationship between the heating temperature in the prebaking step and the top diameter of the post spacer, but is not limited to the specific value of the top diameter. Thereby, FIG. 8 does not show the specific value of the top diameter. In general, when the heating temperature becomes higher, the solvent remained in the glue film will be evaporated more. That is, it may expedite the reaction of the photoresist material for forming the post spacer, and lead the top diameter of the resultant post spacer become larger. Conversely, when the heating temperature becomes lower, the top diameter of the resultant post spacer becomes smaller. Therefore, in order to ensure that the top diameters of the post spacers at different positions on the substrate are uniform, "Zone heating" may be used to compensate for the ununiformity of the top diameters caused in the exposing and the developing. The expression "Zone heating" means that different heating temperatures are adopted as required at the different positions or zones on the substrate. For example, as shown in FIG. 5, according to positions of the post spacers on the substrate, the heating tray 50 may be divided into 25 zones, in each of which the heating wire 502 is provided. In this way, by controlling the respective heating wires 502, the photoresist material at different positions or zones on the substrate may be heated at different heating temperatures. In an embodiment, zones in which the post spacers have smaller top diameters due to the exposing and the developing processes may be heated to a higher temperature, such as 100-120° C., in the prebaking step. In an embodiment zones in which the post spacers have larger top diameters due to the exposing and the developing processes may be heated to a lower temperature, such as 80-90° C., in the prebaking step.

In this way, the external contour or size (such as top diameter) of the post spacer and the position of the post spacer on the substrate may be used as a component parameter of the post spacer; the illumination distribution of the exposure light source on the substrate on which the photoresist component is located in the exposing step and the tilt direction and the tilt degree of the developing machine in the developing step and other factors involved in the processes may be used as a process parameter; and the heating temperature of the heating device may be used as the heating parameter. From the above analysis, there is a matching or associating relationship among the component parameter, the process parameter and the heating parameter. Thereby, by adjusting the heating parameter to match with the component parameter and the process parameter, the sizes (for example, top diameters) of the resultant post spacers may be realized to be uniform.

For example, the matching or associating relationship among the above three kinds of parameters of the heating parameter (for example, the heating temperature), the component parameter of the post spacer (for example, the top diameter of the post spacer and the position of the post spacer on the substrate), and the process parameter (for example, the illumination distribution of the exposure light source, the tilt direction and the tilt degree of the developing machine) may be established. Then, the heating parameter matched or associated with the component parameter and the process parameter may be determined based on the component parameter and/or the process parameter. Then, the post spacers arranged on the substrate may be heated in a manner of "zone heating".

Thereby, according to embodiments of the disclosure, a data table or a database may be established in a memory, sets of component parameters, process parameters and heating parameters (the three kinds parameters in each set have the matching relationship or the associating relationship) are stored in the data table or the database. The data table or the database may be built gradually by many ways, for example, a way where technical personnel manually input the experience value, or a way where various parameters are collected by experiments, or a way where all parameters are collected in the actual production process of manufacturing a large number of post spacers.

Although it has been described in detail the influence of the structure, the forming process and the heating parameter in the prebaking/soft baking processes on the top diameter of the post spacer by taking the post spacer as an example, it should be appreciated for those skilled in this art that the disclosure is also adapted to other components formed on the substrate by the photolithography process. These other components, for example, the black matrix (BM) formed on the color filter substrate, the photo unit formed on the array substrate, and the like, are all formed by the photolithography process, that is, the methods for forming these other components each comprises the pre-baking (i.e. prebaking or soft baking) step, the exposing step and the developing step. Thereby, the above descriptions about the post spacer are also adapted to these other components. Herein, the expression of "photoresist component" may refer to any component formed by a photoresist material, such as photoresist glue or photoresist agent, or by a photolithography process. Herein, the photoresist component comprises, but not limited to, a post spacer, a black matrix, a photo unit formed on an array substrate, and the like. In an embodiment, there is also a matching or associating relationship between the size (such as top width, see TOP SIZE of FIG. 1) of black matrix, and the above process parameter and/or the heating parameter. Thereby, the uniformity of the sizes of the black matrixes (such as the top widths) may also be achieved by heating the black matrixes at different positions or zones on the substrate by different heating temperatures.

Hereafter, it will further describe in detail the method for processing the photoresist component, such as post spacer, according to embodiments of the present disclosure with reference to drawings.

Figure 9:
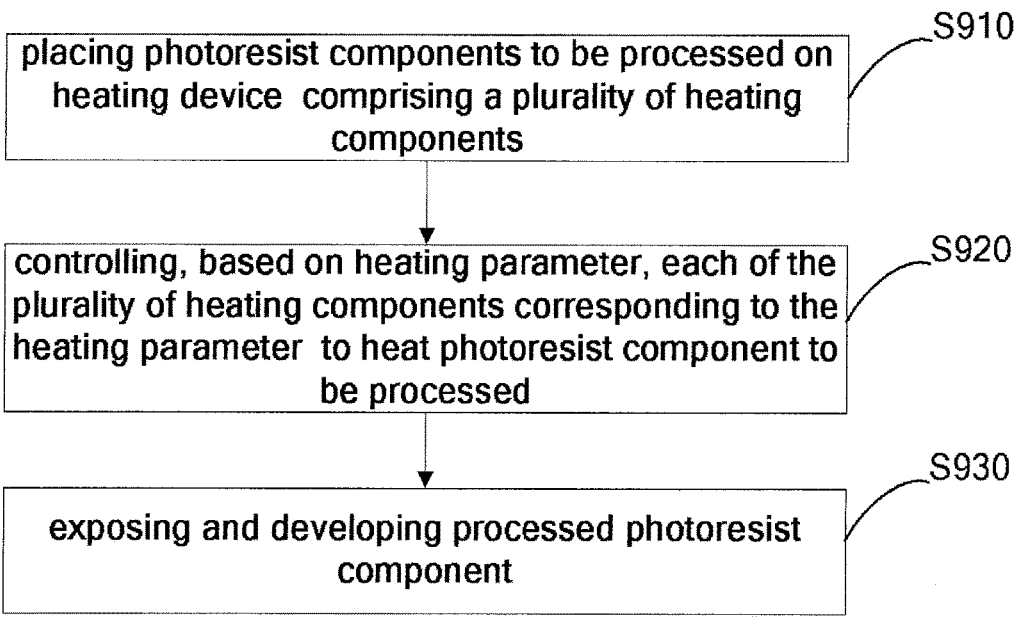
FIG. 9 is an illustrative flow chart of a method for processing a photoresist component according to an embodiment of the present disclosure.

FIG. 9 is an illustrative flow chart of a method for processing a photoresist component according to an embodiment of the present disclosure.

As shown in FIG. 9, in the step S910, placing the photoresist components to be processed on a heating device comprising a plurality of heating components. For example, as shown in FIGS. 4 and 5, the substrate 2 with the photoresist material layer 10' is placed on the heating device 50 with a plurality of heating wires 502.

Then, in the step S920, controlling each of the plurality of heating components matched or associated with a heating parameter based on the heating parameter, so as to heat the photoresist component to be processed. For example, performing the "zone heating" on the substrate 2 with the photoresist material layer 10' by controlling the respective heating wires 502 based on the heating parameter, such as the heating temperature, stored in the data table or the database.

In an embodiment of the present disclosure, the heating parameter is associated with the photoresist component parameter and the process parameter of the photoresist component to be processed. That is, the heating parameter is determined based on the photoresist component parameter and the process parameter of the photoresist component to be processed. For example, the heating parameter may comprise the heating temperatures of the respective heating wires 502. The photoresist component parameter may comprise a size of the photoresist component and a position of the photoresist component on the substrate, for example, the top diameter of the post spacer 10 and the position of the post spacer 10 on the substrate 2. The process parameter may comprise an exposure process parameter and/or a development process parameter. For example, the exposure process parameter may comprise an illumination distribution of an exposure light source on the substrate on which the photoresist component is located. The development process parameter may comprise a tilt direction and a tilt degree of a developing machine. That is, the photoresist components at different positions or zones on the substrate are heated at heating temperatures associated with the different positions or zones according to the illumination distribution and/or the tilt direction and the tilt degree of the developing machine, so as to obtain corresponding sizes of photoresist components.

Hereafter, it will further describe in detail the step of determining the heating parameter based on the photoresist component parameter, and at least one of the exposure process parameter and the development process parameter with reference to drawings.

In an embodiment of the present disclosure, the exposure process parameter comprises an illumination distribution of an exposure light source on the substrate on which the photoresist component is located. In this way, the step of determining the heating parameter based on the photoresist component parameter and at least one of the exposure process parameter and the development process parameter comprises: estimating sizes of the photoresist components at different positions on the substrate according to a direct proportional relationship between the illumination distribution of the exposure light source on the substrate on which the photoresist component is located and the size of the photoresist component; and determining the heating temperature according to an inverse proportional relationship between the estimated size of the photoresist component and the heating temperature.

In the step of estimating sizes of the photoresist components at different positions on the substrate according to the direct proportional relationship between the illumination distribution of the exposure light source on the substrate on which the photoresist component is located and the size of the photoresist component, as described above, the illuminations of the photoresist components at different positions or zones on the substrate are different, it causes the sizes of the resultant photoresist components different. In an embodiment, the illumination distributed on the photoresist component is greater, the size of the photoresist component becomes larger; otherwise, the illumination distributed on the photoresist component is lower, the size of the photoresist component becomes smaller. That is, there is the direct proportional relationship between the illumination distribution of the exposure light source on the substrate on which the photoresist component is located and the size of the photoresist component. In this way, sizes of the photoresist components at different positions on the substrate may be estimated according to the direct proportional relationship.

In the step of determining the heating temperature according to the inverse proportional relationship between the estimated size of the photoresist component and the heating temperature, as described above, if the estimated size of the photoresist component on one zone of the substrate is smaller, the photoresist component on the one zone may be heated to a higher temperature in the prebaking step; if the estimated size of the photoresist component on another zone of the substrate is larger, the photoresist component on the other zone may be heated to a lower temperature in the prebaking step. That is, the heating temperature is determined according to the inverse proportional relationship between the estimated size of the photoresist component and the heating temperature. In this way, the non-uniformity of the sizes of the photoresist components which will be caused by the subsequent process parameters may be compensated in advance in the prebaking step, so that the sizes of the final resultant resist components are uniform.

In some embodiments of the present disclosure, the development process parameter comprises a tilt direction and a tilt degree of a developing machine. The step of determining the heating parameter based on the development process parameter and the photoresist component parameter comprises steps of:

determining an upstream position and a downstream position in a flow direction of developing liquid and determining amounts of the developing liquid at the upstream position and the downstream position of the substrate, respectively, based on the tilt direction and the tilt degree;

estimating the sizes of the photoresist components at different positions on the substrate according to an inverse proportional relationship between the amount of the developing liquid and the size of the photoresist component; and determining the heating temperature according to an inverse proportional relationship between the estimated size of the photoresist component and the heating temperature.

In the step of estimating the sizes of the photoresist components at different positions on the substrate according to the inverse proportional relationship between the amount of the developing liquid and the size of the photoresist component, the amount of the developing liquid distributed on the upstream side (right side of FIG. 6) is less, it will cause the size of the resultant photoresist component smaller; and the amount of the developing liquid distributed on the downstream side (left side of FIG. 6) is more, it will cause the size of the resultant photoresist component larger. In this way, the sizes of the photoresist components at different positions on the substrate may be estimated according to the inverse proportional relationship between the amount of the developing liquid and the size of the photoresist component.

The step of determining the heating temperature according to the inverse proportional relationship between the estimated size of the photoresist component and the heating temperature has been described in the above, and is not repeated herein.

In another embodiment, the processed photoresist component may be exposed, and the exposed photoresist component may be developed. That is, the above heating step is performed in the prebaking/soft baking step for forming the photoresist component, such as post spacer. In the prebaking/soft baking step, the solvent remained in the glue film is further volatilized, thereby, it is possible to control the size of the resultant photoresist component. In addition, in the prebaking/soft baking step, the sizes at different positions or zones are controlled by "zone heating", therefore, it is possible to compensate in advance the non-uniformity of the sizes of the photoresist components that may be caused by the exposing process and/or the developing process.

Figure 10:
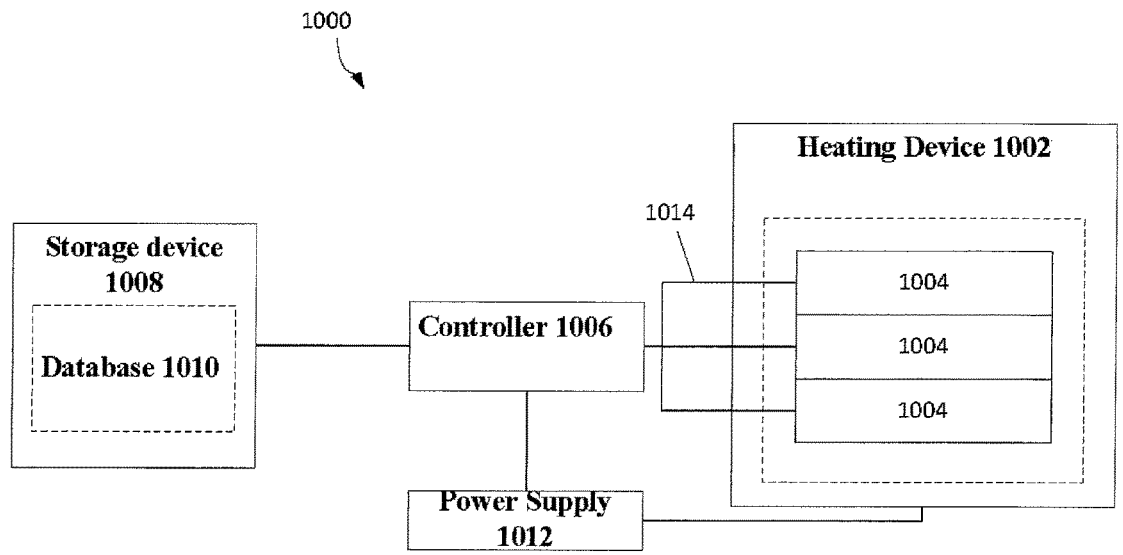
FIG. 10 is an illustrative diagram of a device for processing a photoresist component according to an embodiment of the present disclosure.

Hereafter, it will describe the device for processing the photoresist component, such as post spacer, according to the embodiments of the present disclosure with reference to drawings (for example, FIGS. 4-5 and 10). FIG. 10 is an illustrative diagram of a device for processing a photoresist component according to an embodiment of the present disclosure. As shown in FIG. 10, the device 1000 may comprise a heating device 1002 and a controller 1006. The heating device 1002 comprises a plurality of heating components 1004 and is configured to carry the photoresist component to be processed thereon. The controller 1006 is configured to control each of the plurality of heating components associated with a heating parameter based on the heating parameter, so as to heat the photoresist component to be processed.

In an embodiment, as shown in FIGS. 4-5, the heating device 1002 may comprise a heating tray 50. The heating component 1004 may comprise the heating wire 502.

Similarly, the heating parameter may be associated with the photoresist component parameter and the process parameter of the photoresist component to be processed. That is, the heating parameter may be determined based on the photoresist component parameter and the process parameter of the photoresist component to be processed. For example, the heating temperature may comprise temperatures of the respective heating wires 502. The photoresist component parameter may comprise the size of the photoresist component and the position of the photoresist component on the substrate, for example, the top diameter of the post spacer 10 and the position of the post spacer 10 on the substrate 2. The process parameter may comprise an exposure process parameter and/or a development process parameter. The exposure process parameter may comprise an illumination distribution of an exposure light source on the substrate on which the photoresist component is located. The development process parameter may comprise a tilt direction and a tilt degree of a developing machine. That is, the photoresist components at different positions or zones on the substrate may be heated at heating temperatures corresponding to the different positions or zones according to the illumination distribution and/or the tilt direction and the tilt degree of the developing machine, so as to obtain corresponding sizes of photoresist components.

As shown in FIG. 10, the device 1000 may further comprise a storage device 1008. The storage device 1008 may comprise a storage medium in which a database or a data table 1010 is stored. The storage device 1008 may be configured to store sets of photoresist component parameters, process parameters and heating parameters which are associated with each other. The controller is further configured to read out the heating parameter associated with each heating component 1004, such as the heating wire 502, from the storage device 1008.

In an embodiment, the device 1000 may further comprise a power supply 1012, such as a DC power supply, and control lines 1014. As shown in FIG. 10, the power supply 1012 is used to provide electric power to the heating device 1002, the controller 1006 and the storage device 1008. The control line 1014 are configured to connect the controller 1006 to each heating component 1004, so as to transmit control signals from the controller 1006 to each heating component 1004.

Figure 11:
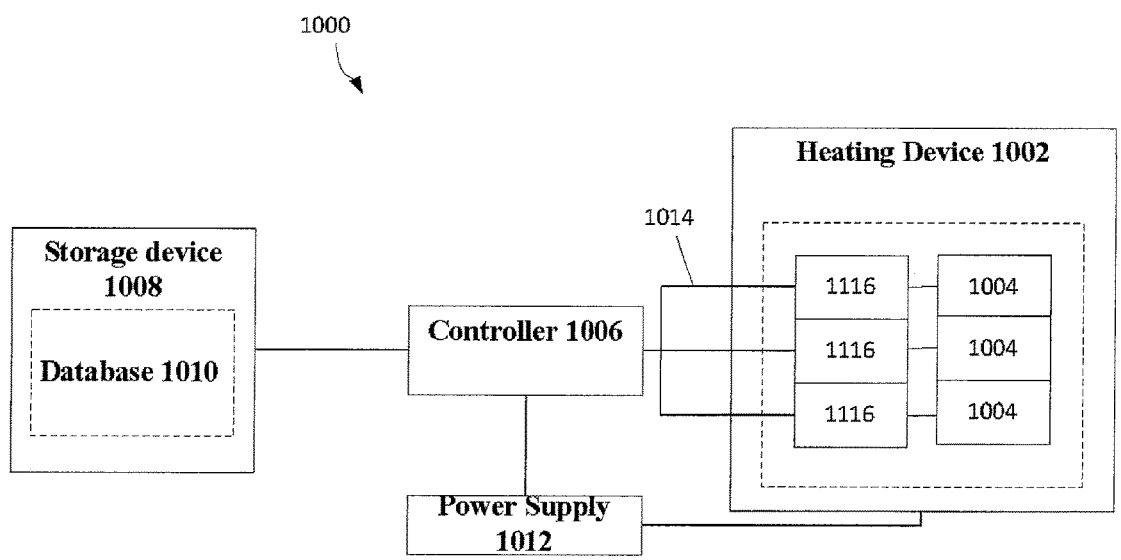
FIG. 11 is an illustrative diagram of a device for processing a photoresist component according to another embodiment of the present disclosure.

FIG. 11 is an illustrative diagram of a device for processing a photoresist component according to another embodiment of the present disclosure. As shown in FIG. 11, the heating device 1002 may comprise a plurality of heating components 1004 and a plurality of temperature controllers 1116 corresponding to the plurality of heating components 1004, respectively. The controller 1106 transmits the heating parameters corresponding to the photoresist components to the temperature controllers 1116, respectively, and the temperature controllers 1116 control the heating components 1104, respectively, based on the respective heating parameters, so as to heat the photoresist components to be processed. It should be appreciated for those skilled in this art that the photoresist components may be heated in a manner of any other zone heating to control the external contours and/or sizes of the photoresist components uniform.

In the method and the device for processing the photoresist component according to above embodiments, the photoresist components at different positions or zones on the substrate are heated by different heat temperatures, so as to improve the uniformity of the external contours or sizes of the resultant photoresist components.

In addition, the method and the device for processing the photoresist component according to above embodiments may compensate for differences in external contours or sizes of the photoresist components caused by other process steps, such as, exposing and developing. Thereby, it may ensure that the external contours or sizes of the resultant photoresist components are uniform.

In the embodiments of the present disclosure, the "controller" or "temperature controller" may be achieved by one or a plurality of logic arithmetic processing circuits. The logic arithmetic process circuit may be comprises, for example, but not limited to, a Central Processing Unit (CPU), an Application Specific Integrated Circuit (ASIC), a Digital Signal Processor (DSP), a Field Programmable Gate Array (FPGA), a Single-Chip Microcomputer (MCU), and the like. The "storage device" may comprises one or a plurality of memory elements, for example, but not limited to, a Random Memory (RAM), a non-volatile memory, a disk memory, a Flash memory, and the like.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A method for processing a photoresist component, comprising steps of:
   placing a photoresist component to be processed on a heating device comprising a plurality of heating components; and
   controlling, based on a heating parameter, each of the plurality of heating components associated with the heating parameter to heat the photoresist component to be processed,
   wherein the heating parameter is determined based on a photoresist component parameter of the photoresist component to be processed and a process parameter of forming the photoresist component,
   wherein the heating parameter comprises a heating temperature, and the photoresist component parameter comprises a size of the photoresist component and a position of the photoresist component on a substrate,
   wherein the process parameter comprises a development process parameter comprising a tilt direction and a tilt degree of a developing machine,
   wherein the method further comprises:
   determining an upstream position and a downstream position in a flow direction of a developing liquid based on the tilt direction and the tilt degree, and determining amounts of the developing liquid at the upstream position and the downstream position of the substrate, respectively;

estimating the sizes of the photoresist components at different positions on the substrate according, to an inverse proportional relationship between the amount of the developing liquid and the size of the photoresist component; and determining the heating temperature according to an inverse proportional relationship between the estimated size if the photoresist component and the heating temperature.

2. The method according to claim 1, wherein the process parameter further comprises an exposure process parameter, and wherein the method further comprises a step of determining the heating parameter based on the photoresist component parameter and both of the exposure process parameter and the development process parameter.

3. The method according to claim 2, wherein the exposure process parameter comprises an illumination distribution of an exposure light source on the substrate on which the photoresist component is located, and wherein the step of determining the heating parameter based on the photoresist component parameter and both of the exposure process parameter and the development process parameter comprises:

estimating sizes of the photoresist components at different positions on the substrate according to a direct proportional relationship between the illumination distribution of the exposure light source on the substrate and the size of the photoresist component; and determining the heating temperature according to an inverse proportional relationship between the estimated size of the photoresist component and the heating temperature.

4. The method according to claim 2, further comprising steps of exposing the processed photoresist component and developing the exposed photoresist component.

5. The method according to claim 1, wherein the photoresist component comprises a post spacer, and the size of the photoresist component comprises a top diameter of the post spacer.

6. The method according to claim 1, wherein the heating device is configured as a heating tray having a plurality of heating components, and wherein the step of heating the photoresist component to be processed comprises a step of heating the photoresist component to be processed by heat contact.

7. A device for processing a photoresist component, comprising:

a heating device comprising a plurality of heating components and configured to carry a photoresist component to be processed thereon; and a controller configured to control, based on a heating parameter, each of the plurality of heating components associated with the heating parameter to heat the photoresist component to be processed, wherein the heating parameter is determined based on a photoresist component parameter of the photoresist component to be processed and a process parameter of forming the photoresist component, wherein the heating parameter comprises a heating temperature, and the photoresist component parameter comprises a size of the photoresist component and a position of the photoresist component on a substrate, wherein the process parameter comprises a development process parameter comprising a tilt direction and a tilt degree of a developing machine, wherein an upstream position and a downstream position in a flow direction of a developing liquid is determined based on the tilt direction and the tilt degree, and amounts of the developing liquid at the upstream position and the downstream position of the substrate are determined, respectively, wherein the sites of the photoresist components at different positions on the substrate are estimated according to an inverse proportional relationship between the amount of the developing liquid and the size of the photoresist component, wherein the heating temperature is determined according to an inverse proportional relationship between the estimated size of the photoresist component and the heating temperature.

8. The device according to claim 7, further comprising:

a storage device configured to store sets of photoresist component parameters, process parameters and heating parameters which are associated with each other, and wherein the controller is further configured to read out the heating parameter associated with each heating component from the storage device.

9. The device according to claim 8, wherein the process parameter further comprises an illumination distribution of an exposure light source on the substrate on which the photoresist component is located.

10. The device according to claim 7, wherein the heating device is configured as a heating tray which is configured to heat the photoresist component to be processed by heat contact.

* * * * *